United States Patent [19]
Lell

[11] Patent Number: 6,081,000
[45] Date of Patent: Jun. 27, 2000

[54] ALAS OXIDE INSULATING LAYER BETWEEN A CONDUCTIVE III-V SUBSTRATE AND AN OPTOELECTRONIC SEMICONDUCTOR DEVICE AND METHOD OF MANUFACTURING THEREOF

[75] Inventor: Alfred Lell, Maxhütte-Haidhof, Germany

[73] Assignee: Siemens Aktiengesellschaft, Munich, Germany

[21] Appl. No.: 09/068,573

[22] PCT Filed: Sep. 11, 1997

[86] PCT No.: PCT/DE97/02038

§ 371 Date: Sep. 14, 1998

§ 102(e) Date: Sep. 14, 1998

[87] PCT Pub. No.: WO98/13864

PCT Pub. Date: Apr. 2, 1998

[30]     Foreign Application Priority Data

Sep. 27, 1996  [DE]   Germany ........................ 196 40 005

[51] Int. Cl.[7] ........................................... H01L 33/00
[52] U.S. Cl. .................... 257/93; 257/506; 257/524; 438/34; 438/46; 438/47; 438/778; 438/779
[58] Field of Search ............... 257/93, 506, 43, 257/88, 102, 103, 524, 613, 615, 516; 438/22, 23, 29, 34, 42, 46, 47, 758, 778, 779, 967

[56]            References Cited

U.S. PATENT DOCUMENTS

| | | | |
|---|---|---|---|
| 3,982,265 | 9/1976 | Johnston, Jr. ............................ | 357/30 |
| 4,216,036 | 8/1980 | Tsang ..................................... | 148/175 |
| 4,291,327 | 9/1981 | Tsang ..................................... | 357/52 |
| 4,952,527 | 8/1990 | Calawa et al. ......................... | 437/107 |
| 5,262,360 | 11/1993 | Holonyak, Jr. et al. ............... | 437/237 |
| 5,332,451 | 7/1994 | Hata et al. . | |
| 5,371,384 | 12/1994 | Wada ..................................... | 257/82 |
| 5,411,914 | 5/1995 | Chen et al. ............................. | 437/107 |
| 5,528,616 | 6/1996 | Kash et al. ............................. | 372/45 |
| 5,686,350 | 11/1997 | Lee et al. ............................... | 437/126 |
| 5,780,873 | 7/1998 | Itaya et al. ............................. | 257/521 |
| 6,008,506 | 12/1999 | Morikawa ............................... | 257/85 |

FOREIGN PATENT DOCUMENTS 10-51075   2/1998   Japan .
93/23877  11/1993   WIPO .

OTHER PUBLICATIONS

B. KIM Member, IEEE, et al., "Microwave Power GaAs MISFET's with Undoped AlGaAs as An Insulator", IEEE Electron Device Letters, vol. EDL–5, No. 11, Nov. 1984, pp. 494–495.

Applied Physics Letters, "Molecular beam epitaxial growth of InGaAlAs/InGaAs heterojunction bipolar transistors on highly resistive low temperature InAlAs epilayers", No. 23, Dec. 1992, pp. 2796–2798.

Applied Physics Letters, "Wet oxidation of AlAs grown by molecular beam epitaxy", No. 21, Nov. 1994, pp. 2717–2719.

MacDougal et al., "Ultralow Threshold Current Vertical–Cavity Surface–Emitting Lasers with AlAs Oxide–GaAs Distributed Bragg Reflectors", IEEE Photonics Technology Letters, No. 3, Mar. 1995, pp. 229–231.

Applied Optics, vol. 27, No. 15.

Honsberg, "Fabrication and Characteristics of MCRW GaAs/GaAlAs Lasers on Semiinsulating Substrate", Journal of Optical Communications, Jun. 1995, pp. 42–43.

Tsutsui et al., "MESFET's on GaAs–on–Insulator Structure", IEEE Electron Device Letters, vol. EDL–8, No. 6, Jun. 1987, pp. 277–279.

Mikroelektronik–technologie, 1991, pp. 104–105.

*Primary Examiner*—Jerome Jackson, Jr.
*Assistant Examiner*—Bradley W. Baumeister
*Attorney, Agent, or Firm*—Hill & Simpson

[57]            ABSTRACT

An optoelectronic semiconductor device, whereby at least one functional semiconductor structure is arranged on a II-V semiconductor substrate. Inventively, an electrically conductive III-V semiconductor substrate is provided that exhibits a charge carrier concentration of more than $1*10^{15}$ cm$^{-3}$. At least one electrically insulating oxide layer is provided between the functional semiconductor structure and the III-V semiconductor substrate.

8 Claims, 1 Drawing Sheet

ALAS OXIDE INSULATING LAYER BETWEEN A CONDUCTIVE III-V SUBSTRATE AND AN OPTOELECTRONIC SEMICONDUCTOR DEVICE AND METHOD OF MANUFACTURING THEREOF

BACKGROUND OF THE INVENTION

1. Field of the Invention

The present invention is directed to an optoelectronic semiconductor device, whereby at least one functional optoelectronic semiconductor structure is allocated to a first principal surface of an electrically conductive III-V semiconductor substrate, and whereby the functional optoelectronic semiconductor is electrically insulated from a second principal surface of the III-V semiconductor substrate lying opposite the first principal surface.

2. Description of the Related Art

Such a semiconductor device is known, for example, from the publication by Franklin S. Harris, Jr., Applied Optics, Vol. 27, No. 15, page 3141. This discloses a photodiode array, whereby a plurality of AlGaAs/GaAs photodiodes are monolithically integrated on what is referred to as a semi-insulating GaAs substrate.

Further, the publication by G. Muller, M. Honsberg, Journal of Optical Communications 6 (1985), June No. 2, Berlin, Germany, page 42, discloses an MCRW (Metal Clad Ridge Waveguide) laser structure that is applied on a semi-insulating GaAs substrate. Here, the semi-insulating GaAs substrate serves the purpose of electrically insulating a plurality of components that are monolithically integrated on the substrate from one another.

The insulating effect of semi-insulating substrates is achieved via the incorporation of deep imperfection levels (for example, Cr or, respectively, C given GaAs substrates and Fe given InP substrates). However, the incorporation of such dopants into a III-V crystal lattice involves a number of difficulties both in the manufacture as well as in the manipulation. Thus, for example, it is extremely difficult to homogeneously incorporate these dopants into the III-V crystal lattice, as a result whereof the realization of a uniform insulating effect over the entire area of a semi-insulating substrate is made more difficult. Compared, for example, to the manufacture of semiconductor components on conductive GaAs substrates, the production yield in the production yield in the manufacture of semiconductor components with semi-insulating substrates is therefore very low.

A further problem of semi-insulating semiconductor substrates is comprised therein that their insulating effect already drastically decreases given moderate temperature elevation since free charge carriers are generated in the semiconductor crystal.

SUMMARY OF THE INVENTION

The present invention is based on the object of developing an optoelectronic semiconductor device of the species initially cited wherein the electrical insulation properties between the functional semiconductor structure and the second principal surface of the of the III-V semiconductor substrate are subject to optimally few fluctuations, and whereby the corresponding electrical insulating effect is also adequately high at temperature elevations usually occurring during the operation of optoelectronic semiconductor components such as, for example, particularly arise given power semiconductor as well as in motor vehicles (ambient temperature fluctuations).

This and other objects and advantages are achieved by an optoelectronic semiconductor device. having a III-V semiconductor substrate; at least one functional optoelectronic semiconductor structure allocated to a first principal surface of the III-V semiconductor substrate; the functional semiconductor structure being electrically insulated from a second principal surface the III-V semiconductor substrate lying opposite the first principal surface; the III-V semiconductor substrate being electrically conductive; and at least one electrically insulating oxide layer being provided between the functional optoelectronic semiconductor structure and the III-V semiconductor substrate. Advantageous developments and preferred embodiments of the inventive semiconductor device are provided when the III-V semiconductor substrate exhibits a charge carrier concentration of greater than $1*10^{15}$ cm$^{-3}$ at room temperature. In a more specific embodiment, the electrically conductive III-V semiconductor substrate exhibits a charge carrier concentration between $1*10^{16}$ cm$^{-3}$ and $1*10^{19}$ $^9$cm$^{-3}$ at room temperature. In a preferred embodiment, an AlAs oxide layer is arranged between the III-V semiconductor substrate and the functional semiconductor structure. The functional semiconductor structure is an MCRW laser structure in one application. Alternately, the functional semiconductor structure is a plurality of photodiode structures that form a photodiode field.

The functional optoelectronic semiconductor structure is, in one embodiment, a first monolithically integrated functional semiconductor structure and a second monolithically integrated functional semiconductor structure is provided on the electrically conductive III-V semiconductor substrate; and at least one electrically insulating oxide layer is arranged between each of the functional semiconductor structures and the electrically conductive III-V semiconductor substrate. Preferably, the first and second monolithically integrated functional semiconductor structures are two mutually different kinds. A preferred method for the manufacture of an inventive semiconductor device includes the method steps of: producing an electrically conductive III-V semiconductor substrate; applying or forming an electrically insulating oxide layer on the electrically conductive III-V semiconductor substrate; applying an active layer system onto the electrically insulating oxide layer; and producing at least two functional semiconductor structures electrically insulated from one another by parting the active layer system down to the electrically insulating oxide layer along parting lines between the functional semiconductor structures.

In an opto-electronic semiconductor device of the species initially cited, at least one electrically insulating oxide layer is inventively arranged between the functional semiconductor substrate and the III-V semiconductor. This particularly has the advantage that a conductive substrate that can be manufactured significantly more simply and, thus, more cost-beneficially can be employed instead of a semi-insulating substrate that is involved in terms of manufacture. The electrically insulating oxide layer assumes the electrical insulation of the functional semiconductor structure from the second principal surface of the III-V semiconductor substrate.

In a preferred development of the inventive semiconductor device, an electrically conductive III-V semiconductor substrate that exhibits a charge carrier concentration of $>1 \cdot 10^{15}$ cm$^{-3}$ at room temperature is provided. It is especially advantageous when the electrically conductive III-V semiconductor substrate exhibits a charge carrier concentration between $1 \cdot 10^{16}$ cm$^{-3}$ and $1 \cdot 10^{19}$ cm$^{-3}$ at room temperature, i.e. at approximately 20° C. Large numbers of such III-V semiconductor substrates are manufactured for traditional III-V semiconductor components and these are therefore cost-beneficially available.

In another preferred development of the inventive semiconductor device, at least two monolithically integrated functional semiconductor structures are allocated to the electrically conductive III-V semiconductor substrate. In this way, an integrated circuit arrangement composed of a plurality of III-V semiconductor components (functional semiconductor structures) can be realized on a single III-V semiconductor substrate in a simple way.

In an advantageous embodiment of the inventive semiconductor device, at least two different types of monolithically integrated, functional semiconductor structures are provided on a single electrically conductive III-V semiconductor substrate.

In a preferred method for manufacturing an inventive semiconductor device, an electrically insulating oxide layer is first produced on a pre-fabricated, conductively doped III-V semiconductor substrate. An active layer system of at least one functional semiconductor structure is then applied thereon. Subsequently, functional semiconductor structures that are electrically insulated from one another are produced by parting (for example, parting etching or sawing) of the active layer system along parting lines between the functional semiconductor structures down to the electrically insulating oxide layer. These, of course, can then be electrically interconnected with one another by contact metallizations and, potentially, connected to externally arranged, further components.

Instead of parting the active layer system, of course, parting diffusions can also be provided that electrically insulate the functional semiconductor structures from one another. Additional dopants are thereby introduced into the active layer system between the functional semiconductor structures. Such parting diffusions are known in semiconductor technology and are therefore not explained in greater detail here.

BRIEF DESCRIPTION OF THE DRAWINGS

The inventive semiconductor device is explained in greater detail below on the basis of two exemplary embodiments in conjunction with FIGS. 1 and 2

DETAILED DESCRIPTION OF THE PREFERRED EMBODIMENTS

Figure 1:
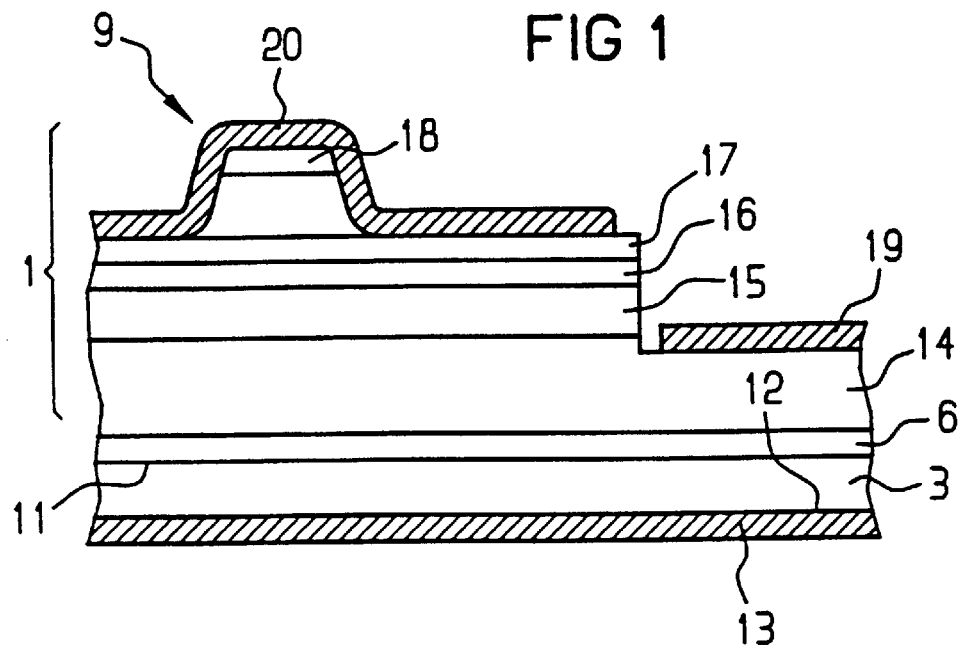
FIG. 1 is a schematic illustration of a sectional view of a first exemplary embodiment of the inventive semiconductor device.

The functional semiconductor structure 1 of FIG. 1 is a matter of an MCRW laser structure 9. This is applied on a layer sequence composed of a III-V semiconductor substrate 3 and of an electrically insulating oxide layer 6 applied thereon or formed thereon. The III-V semiconductor substrate 3 is manufactured, for example, of n-doped GaAs, and the electrically insulating oxide layer 6 is composed, for example, of AlAs oxide. Any other, suitable electrically insulating layer can also be employed in stead of the oxide layer 6.

A metallization layer 13 composed, for example, of Cr/In is applied on a second principal surface 12 lying opposite a first principal surface 11 of the III-V semiconductor substrate 3—this is the surface on which the first doped III-V semiconductor layer is applied. This metallization layer 13 serves, for example, the purpose of soldering the semiconductor device onto a heat sink fabricated of copper. The dopants usually employed for III-V semiconductors in semiconductor technology, for example, are employed as dopants for the present III-V semiconductor substrate 3. These are therefore not explained in greater detail here.

The functional semiconductor structure 1 of the MCRW laser structure 9 is applied onto the electrically insulating oxide layer 6, for example with MOVPE or MBE. Proceeding from the electrically insulating oxide layer 6, this is composed, for example, of an $n^+$-doped GaAs layer 14, of an n-doped GaAlAs layer 15, of an active layer 16 of undoped GaAs or of an active layer sequence/system, of a p-doped GaAlAs layer 17 and of a p+-doped GaAs layer 18. The $n^+$-doped GaAs layer 14 is provided, for example, with an n-contact 19 composed of AuGe/Ni/Au, and the p-doped GaAlAs layer 17 as well as the $p^+$-doped GaAs layer 18 is provided with a p-contact metallization 20 that, for example, is composed of a Cr/Au, Cr/Pt/Au, Ti/Pt/Au or Ti/Au layer sequence. This is a traditional MCRW laser which is known to a person skilled in the art that therefore requires no further explanation here.

Of course, a plurality of MCRW laser structures 9 that are electrically insulated from one another can be fashioned on a III-V semiconductor substrate 3 with an electrically insulating oxide layer 6 according to the first exemplary embodiment. What is thereby exclusively meant is the electrical insulation by the substrate. The individual MCRW laser structures, of course, can be interconnected with one another via metallization tracks.

Figure 2:
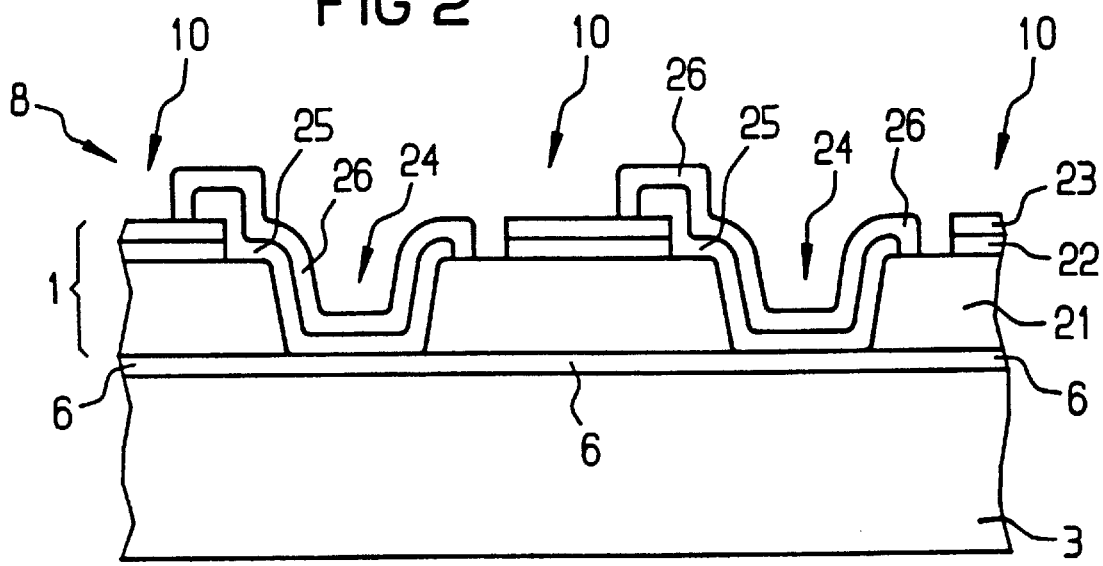
FIG. 2 is a schematic sectional view of a second embodiment of an inventive semiconductor device.

FIG. 2 shows an exemplary embodiment of an inventive semiconductor device wherein a plurality of photodiode structures 10 of a photodiode field 8 are applied on a single electrically conductive III-V semiconductor substrate 3. A respective electrically insulating oxide layer 6 is arranged between the photodiode structures 10 and the electrically conductive III-V semiconductor substrate 3 that, for example, is composed of n-doped GaAs. This oxide layer 6 is composed, for example, of AlAs oxide. Proceeding from the electrically insulating oxide layer 6, the photodiodes are respectively composed of an n-doped GaAs layer 21, of a p-doped GaAs layer 22 and of a p-doped AlGaAs layer 23. The individual photodiode structures 10 separated from one another are produced in that this layer sequence is parted along predetermined parting lines, for example by etched trenches 24. The insides of the etched trenches 24 are provided with an insulation layer 25 composed, for example, of $SiO_2$ on which a metallization layer 26 via which the individual photodiode structures 10 are serially interconnected with one another is in turn applied.

This semiconductor device is also a traditional semiconductor component such as known to a person skilled in the art and is therefore not explained in greater detail here.

Instead of the III-V semiconductor substrate of Ga As, of course, any other III-V semiconductor material can also be employed in the inventive semiconductor device dependent on the type of semiconductor structure to be applied onto the substrate. Of course, it can also be fashioned to be p-conductive. The electrically insulating oxide layer is then to be correspondingly adapted.

One advantage of conductive III-V semiconductor substrates compared to semi-insulating substrates is comprised therein that the crystal growth method can be significantly more simple governed. This leads to more uniform wafers whose dopant (generally Si) is also distinguished by lower diffusion effects.

Advantageously, the electrically insulating oxide layer 6 between the doped III-V semiconductor substrate 3 and the active epitaxy layer system (functional semiconductor structure 1) is an oxidized AlAs epitaxy layer (this applies to both exemplary embodiments).

The oxidation of the AlAs layer can ensue either by designational contamination during the epitaxy or by a 2-stage epitaxy wherein an AlAs layer is first grown onto the III-v semiconductor substrate 3 and is subsequently oxidized in air. After this, the active epitaxy layer system is grown onto the AlAs layer.

However, the active epitaxy layer system can also be applied to the as yet unoxidized AlAs epitaxy layer. The oxidation of the AlAs layer then ensues by oxidation of the completely processed component. The lateral surface uncovered by the component parting (detachment of a wafer) is generally adequate for the desired oxidation of the AlAs layer.

Of course, it is also inventively provided to arrange different kinds of functional semiconductor structures, for example photodiodes, light-emitting diodes, transistors, etc., on one and the same electrically conductive III-V semiconductor substrate. Although other modifications and changes may be suggested by those skilled in the art, it is the intention of the inventor to embody within the patent warranted hereon all changes and modifications as reasonably and properly come within the scope of their contribution to the art.

I claim:

1. An optoelectronic semiconductor device, comprising:
   a III-V semiconductor substrate;
   at least one functional optoelectronic semiconductor structure allocated to a first principal surface of said III-V semiconductor substrate; said functional semiconductor structure being electrically insulated from a second principal surface said III-V semiconductor substrate lying opposite the first principal surface; and
   an AlAs oxide layer arranged between said III-V semiconductor substrate and said functional semiconductor structure.

2. An optoelectronic semiconductor device as claimed in claim 1, wherein said functional semiconductor structure is an MCRW laser structure.

3. An optoelectronic semiconductor device as claimed in claim 1, wherein said functional semiconductor structure is a plurality of photodiode structures that form a photodiode field.

4. An optoelectronic semiconductor device as claimed in claim 1, wherein said at least one functional optoelectronic semiconductor structure is a first monolithically integrated functional semiconductor structure and further comprising:
   a second monolithically integrated functional semiconductor structure provided on the electrically conductive III-V semiconductor substrate; and
   at least one electrically insulating oxide layer is arranged between each of the functional semiconductor structures and the electrically conductive III-V semiconductor substrate.

5. An optoelectronic semiconductor device according to claim 4, wherein said first and second monolithically integrated functional semiconductor structures are two mutually different kinds.

6. An optoelectronic semiconductor device comprising:
   a III-V semiconductor substrate;
   at least one functional optoelectronic semiconductor structure allocated to a first principal surface of said III-V semiconductor substrate; said functional semiconductor structure being electrically insulated from a second principal surface said III-V semiconductor substrate lying opposite the first principal surface;
   said III-V semiconductor substrate being electrically conductive; and at least one electrically insulating oxide layer being provided between the functional
   optoelectronic semiconductor structure and the III-V semiconductor substrate;
   wherein said III-V semiconductor substrate exhibits a charge carrier concentration of greater than $1*10^{15}$ cm$^{-3}$ at approximately 20° C.

7. An optoelectronic semiconductor device comprising:
   a III-V semiconductor substrate;
   at least one functional optoelectronic semiconductor structure allocated to a first principal surface of said III-V semiconductor substrate; said functional semiconductor structure being electrically insulated from a second principal surface said III-V semiconductor substrate lying opposite the first principal surface;
   said III-V semiconductor substrate being electrically conductive; and
   at least one electrically insulating oxide layer being provided between the functional optoelectronic semiconductor structure and the III-V semiconductor substrate;
   wherein said electrically conductive III-V semiconductor substrate exhibits a charge carrier concentration between $1*10^{16}$ cm$^{-3}$ and $1*10^{19}$ cm$^{-3}$ at approximately 20° C.

8. A method for the manufacture of an optoelectronic semiconductor device, comprising the method steps:
   a) producing an electrically conductive III-V semiconductor substrate;
   b) applying or forming an electrically insulating oxide layer on the electrically conductive III-V semiconductor substrate, said step of applying or forming said electrically insulating oxide layer including applying or forming an AlAs oxide layer;
   c) applying an active layer system onto the electrically insulating oxide layer; and
   d) producing at least two functional semiconductor structures electrically insulated from one another by parting the active layer system down to the electrically insulating oxide layer along parting lines between the functional semiconductor structures.

* * * * *